(12) United States Patent
Seddon et al.

(10) Patent No.: US 9,219,010 B2
(45) Date of Patent: Dec. 22, 2015

(54) METHOD OF MANUFACTURING A SEMICONDUCTOR COMPONENT

(71) Applicant: Semiconductor Components Industries, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENETS INDUSTRIES, LLC, Phoenix, AZ (US)

( * ) Notice: Subject to any disclaimer, the term of this patent is extended or adjusted under 35 U.S.C. 154(b) by 381 days.

(21) Appl. No.: 13/889,573

(22) Filed: May 8, 2013

(65) Prior Publication Data

US 2013/0244418 A1 Sep. 19, 2013

Related U.S. Application Data

(62) Division of application No. 12/569,732, filed on Sep. 29, 2009, now Pat. No. 8,445,375.

(51) Int. Cl.
*H01L 21/44* (2006.01)
*H01L 21/768* (2006.01)
(Continued)

(52) U.S. Cl.
CPC .......... *H01L 21/76885* (2013.01); *H01L 23/58* (2013.01); *H01L 24/03* (2013.01); *H01L 24/05* (2013.01); *H01L 24/11* (2013.01); *H01L 24/13* (2013.01); *H01L 23/3157* (2013.01); *H01L 2224/02126* (2013.01); *H01L 2224/0345* (2013.01); *H01L 2224/03912* (2013.01); *H01L 2224/0401* (2013.01); *H01L 2224/05027* (2013.01); *H01L 2224/05166* (2013.01); *H01L 2224/05572* (2013.01); *H01L 2224/05647* (2013.01); *H01L 2224/11472* (2013.01); *H01L 2224/11474* (2013.01); *H01L 2224/11906* (2013.01); *H01L 2224/11914* (2013.01); *H01L 2224/136* (2013.01);

(Continued)

(58) Field of Classification Search
CPC .......... H01L 2924/00014; H01L 2924/00013; H01L 2224/13582; H01L 2224/05552; H01L 2224/0345; H01L 2224/05647; H01L 2224/13147; H01L 2224/13155; H01L 2224/136; H01L 2224/13611; H01L 2224/13644

See application file for complete search history.

(56) References Cited

U.S. PATENT DOCUMENTS 5,376,584 A  12/1994 Agarwala
6,413,851 B1  7/2002 Chow et al.
(Continued)

FOREIGN PATENT DOCUMENTS

CN  1665006 A  9/2005

*Primary Examiner* — Meiya Li
(74) *Attorney, Agent, or Firm* — Rennie William Dover

(57) ABSTRACT

A method for manufacturing a semiconductor component that includes the use of multiple layers of photoresist. A first layer of electrically conductive material is formed over a substrate and a first layer of photoresist is formed over the first layer of electrically conductive material. A portion of the first layer of photoresist is removed leaving photoresist having sidewalls separated by a gap. A second layer of electrically conductive material having first and second sidewalls is formed in the gap. A second layer of photoresist is formed over the first layer of photoresist and over the second layer of electrically conductive material. Portions of the second layer of photoresist and the first layer of photoresist are removed to uncover the first and second edges of the second layer of electrically conductive material. A protective structure is formed over the first and second edges of the second electrically conductive material.

20 Claims, 4 Drawing Sheets

(51) Int. Cl.
*H01L 23/00* (2006.01)
*H01L 23/58* (2006.01)
*H01L 23/31* (2006.01)

(52) U.S. Cl.
CPC ............ *H01L 2224/13007* (2013.01); *H01L 2224/13147* (2013.01); *H01L 2224/13155* (2013.01); *H01L 2224/13562* (2013.01); *H01L 2224/13582* (2013.01); *H01L 2224/13583* (2013.01); *H01L 2224/13584* (2013.01); *H01L 2224/13611* (2013.01); *H01L 2224/13644* (2013.01); *H01L 2224/13647* (2013.01); *H01L 2224/13655* (2013.01); *H01L 2224/13664* (2013.01); *H01L 2924/0002* (2013.01); *H01L 2924/00013* (2013.01); *H01L 2924/00014* (2013.01); *H01L 2924/014* (2013.01); *H01L 2924/01006* (2013.01); *H01L 2924/01013* (2013.01); *H01L 2924/01022* (2013.01); *H01L 2924/01029* (2013.01); *H01L 2924/01033* (2013.01); *H01L 2924/01046* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/14* (2013.01)

(56) References Cited

U.S. PATENT DOCUMENTS

| | | | |
|---|---|---|---|
| 6,683,375 | B2 | 1/2004 | Joshi et al. |
| 6,753,605 | B2 | 6/2004 | Joshi |
| 2004/0185649 | A1* | 9/2004 | Huang ............... H01L 24/11 438/612 |
| 2007/0290343 | A1 | 12/2007 | Harada et al. |

\* cited by examiner

METHOD OF MANUFACTURING A SEMICONDUCTOR COMPONENT

CROSS REFERENCE TO RELATED APPLICATION

The present application is a divisional application of prior U.S. patent application Ser. No. 12/569,732, filed on Sep. 29, 2009, by Michael J. Seddon et al., title "METHOD OF MANUFACTURING A SEMICONDUCTOR COMPONENT AND STRUCTURE" which is hereby incorporated by reference in its entirety, and priority thereto for common subject matter is hereby claimed.

TECHNICAL FIELD

The present invention relates, in general, to semiconductor components and, more particularly, to metallization systems in semiconductor components.

BACKGROUND

Semiconductor components include one or more semiconductor devices manufactured from a semiconductor substrate. Typically, metal interconnects are formed over the semiconductor substrate to electrically connect semiconductor devices to each other or to electrical contacts for transmission of electrical signals to other devices. FIG. 1 is a cross-sectional view of a prior art semiconductor component 10 formed from a silicon substrate 12. Although not shown, semiconductor devices are formed from silicon substrate 12. An aluminum layer 14 is formed on silicon substrate 12 and a dielectric passivation layer 16 is formed over a portion of aluminum layer 14 and over silicon substrate 12. A seed metal layer 18 is formed on the portion of aluminum layer 14 that is unprotected by dielectric passivation layer 16 and over a portion of dielectric passivation layer 16. A copper interconnect 20 having a top surface 26 and side surfaces 28 is formed on seed metal layer 18 using an electroplating technique. An electroless nickel gold (Ni/Au) protective structure 22 is formed on the exposed surfaces of copper interconnect 20, where protective structure 22 comprises a layer of nickel 23 formed on copper interconnect 20 and a layer of gold 25 formed on nickel layer 23. Aluminum layer 14, seed metal layer 18, and copper interconnect 20 form a metallization system 24. A drawback with this approach is that when seed metal layer 18 is etched away, it may be overetched or undercut forming an undercut region 19. Acids or other contaminants may be trapped in undercut region 19 which cause corrosion and degrade the reliability of semiconductor component 10. Another drawback is that the manufacturing flow includes two separate and expensive plating processes.

FIG. 2 is a cross-sectional view of another prior art semiconductor component 50. Semiconductor component 50 is similar to semiconductor component 10 except that protective structure 22 is absent from top surface 26 and side surfaces 28 and an electroplated metal structure 52 is formed on top surface 26 of copper interconnect 20 but is absent from side surfaces 28. An electroplated metal structure 52 may be an comprised of a first electroplated metal layer 53 in contact with copper interconnect 20 and a second electroplated metal layer 55 in contact with the first electroplated metal layer 53. The first electroplated metal layer 53 may be nickel and the second electroplated metal layer 55 may be palladium or the first electroplated metal layer 53 may be nickel and the second electroplated metal layer 55 may be gold or the like. A layer of gold 54 is formed on the electroplated metal structure 52 comprising nickel and palladium. A disadvantage of semiconductor component 50 is that side surfaces 28 are unprotected and susceptible to corrosion and electromigration.

Accordingly, it would be advantageous to have a method for protecting metallization systems and a metallization system that protects against electro-migration and corrosion. It would be of further advantage for the method and structure to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

In the following description and claims, the terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Generally the present invention provides a method for manufacturing the semiconductor component that protects the metallization systems of the semiconductor component from damage by, for example, electromigration. In accordance with an embodiment of the present invention, the semiconductor component is manufactured using a plurality of photosensitive materials such as, for example, photoresist layers during the formation of a copper protective layer. For example, a first electrically conductive material is formed over the major surface of a substrate, wherein the first electrically conductive material has a plurality of edges. A first layer of photoresist is formed over the first electrically conductive material. A portion of the first layer of photoresist is removed leaving first and second sidewalls and a gap between the first and second sidewalls. A second electrically conductive material is formed in the gap between the first and second sidewalls of the first layer of photoresist, wherein the second electrically conductive material has first and second edges. Portions of the first and second layers of photoresist are removed to uncover the first and second edges of the second electrically conductive material. A protective structure is formed over the first and second edges of the second electrically conductive material.

Figure 1:
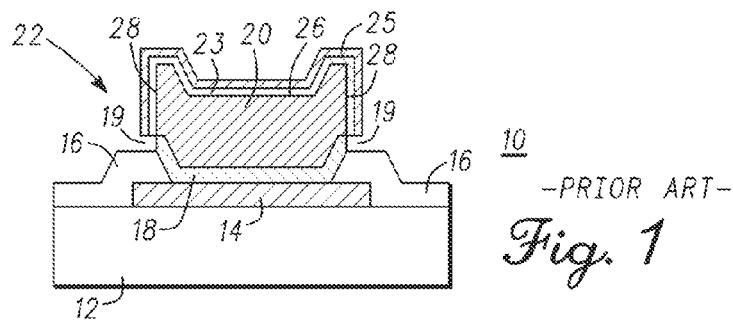
FIG. 1 is a cross-sectional view of a prior art semiconductor component having a metallization system formed over a semiconductor substrate.
Figure 2:
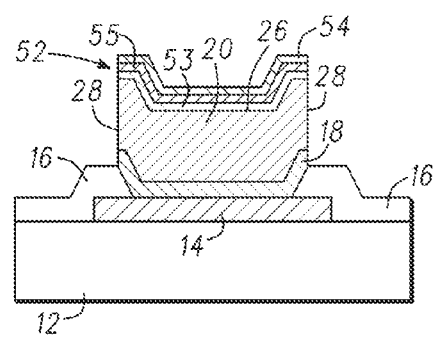
FIG. 2 is a cross-sectional view of another prior art semiconductor component having a metallization system formed over a semiconductor substrate.
Figure 3:
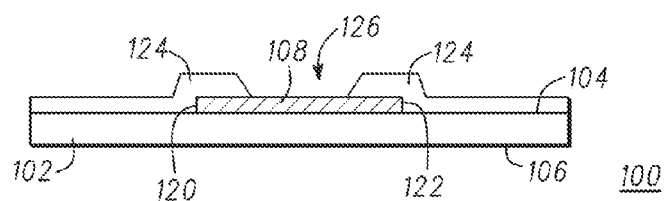
FIG. 3 is a cross-sectional view of a semiconductor component at an early stage of manufacture having a metallization system formed over a semiconductor substrate in accordance with an embodiment of the present invention.

FIG. 3 is a cross-sectional view of a portion of a semiconductor component 100 during manufacture in accordance with an embodiment of the present invention. What is shown in FIG. 3 is a material 102 having opposing surfaces 104 and 106. Surface 104 is referred to as a front or top surface and surface 106 is referred to as a bottom or back surface. Material 102 may be a semiconductor material such as, for example, an epitaxial layer formed on a semiconductor substrate, a semiconductor substrate, a substrate such as, for example, a printed circuit board, or the like. In accordance with embodiments in which material 102 is a semiconductor material, one or more semiconductor devices may be formed in or from semiconductor material 102. When a single semiconductor device is formed in or from semiconductor material 102, it is typically referred to as a discrete device and when a plurality of semiconductor devices are formed in or from semiconductor material 102 they typically referred to as an integrated circuit.

An electrically conductive structure or material 108 having edges 120 and 122 is formed on or over semiconductor material 102. By way of example, electrically conductive structure 108 is aluminum. Other suitable materials for electrically conductive structure 108 include, copper, aluminum copper, aluminum silicon, aluminum silicon copper, or the like. Electrically conductive structure 108 may serve as a bond pad, an electrical interconnect, a power bus, or the like. A passivation layer 124 comprising a dielectric material is formed on or over semiconductor material 102 and an opening 126 is formed in passivation layer 124 which opening exposes a portion of electrically conductive structure 108.

Figure 4:
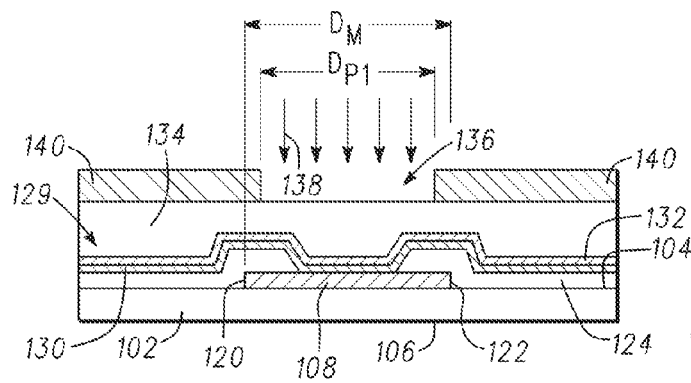
FIG. 4 is a cross-sectional view of the semiconductor component of FIG. 3 at a later stage of manufacture.

Referring now to FIG. 4, an electrically conductive structure or material 129 is formed on passivation layer 124 and on the exposed portion of electrically conductive structure 108. In accordance with an embodiment of the present invention, electrically conductive structure 129 is comprised of a second electrically conductive layer 132 formed on a first electrically conductive layer 130 which preferably is in contact with electrically conductive structure 108. By way of example, the first electrically conductive layer 130 is a titanium tungsten (TiW) layer that is formed by sputter deposition and the second electrically conductive layer 132 is a copper (Cu) layer that is also formed by sputter deposition. The first electrically conductive layer 130 and the second electrically conductive layer 132 may be referred to as a seed metal layer or under bump metallization. A layer of a photosensitive material such as photoresist layer 134 is formed on electrically conductive structure 129, i.e., photoresist layer 134 is formed on electrically conductive layer 132. In accordance with embodiments of the present invention, photoresist layer 134 is a positive photoresist.

A portion 136 of photoresist layer 134 is exposed to light 138 such as, for example UltraViolet (UV) radiation, through a plating mask 140. A dimension $D_{P1}$ represents a dimension of exposed portion 136 and a dimension $D_M$ represents a dimension of electrically conductive structure 108. By way of example, dimension $D_{P1}$ is a width of portion 136 and dimension $D_M$ is a width of electrically conductive structure 108. Although dimension $D_{P1}$ of portion 136 is shown as being less than the dimension $D_M$ of electrically conductive structure 108, this is not a limitation of the present invention. Dimension $D_{P1}$ can be greater than dimension $D_M$ or equal to dimension $D_M$.

Figure 5:
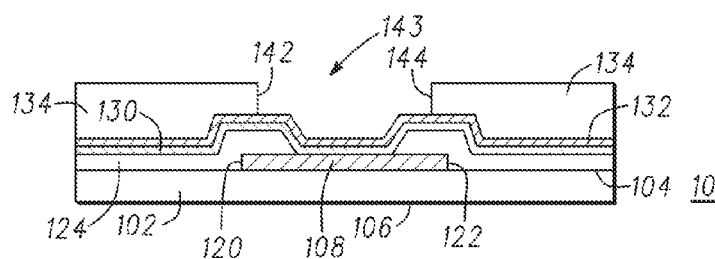
FIG. 5 is a cross-sectional view of the semiconductor component of FIG. 4 at a later stage of manufacture.

Referring now to FIG. 5, the exposed portion of photoresist layer 134 is developed which removes a portion 136 of photoresist layer 134. Removing portion 136 leaves sidewalls 142 and 144 and uncovers a portion of electrically conductive layer 132, leaving a gap 143 between sidewalls 142 and 144.

Figure 6:
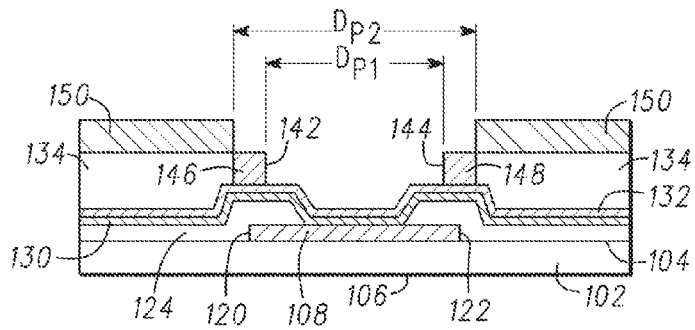
FIG. 6 is a cross-sectional view of the semiconductor component of FIG. 5 at a later stage of manufacture.

Referring now to FIG. 6, portions 146 and 148 of photoresist layer 134 are exposed to light 138 through a plating mask 150. It should be noted that a hard bake may be or may not be performed before the removal of portion 136 or before exposing photoresist layer 134 a second time, i.e., the hard bake is an optional step. A dimension $D_{P2}$ represents a dimension of the portion of photoresist layer 134 that is exposed by plating mask 150. Dimension $D_{P2}$ is greater than dimension $D_{P1}$ and may be less than dimension $D_M$, greater than dimension $D_M$, or equal to dimension $D_M$. In the example shown in FIG. 5, dimension $D_{P2}$ is greater than dimension $D_M$.

Figure 7:
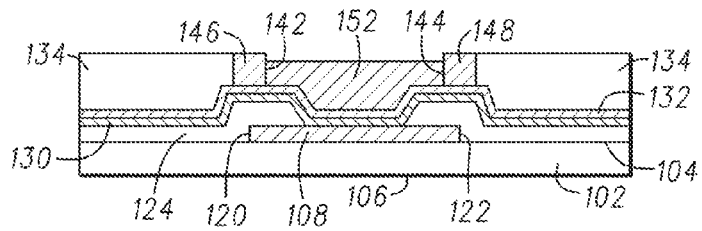
FIG. 7 is a cross-sectional view of the semiconductor component of FIG. 6 at a later stage of manufacture.

Referring now to FIG. 7, before developing exposed portions 146 and 148 of photoresist layer 134, an electrically conductive structure 152 is formed on the exposed portion of electrically conductive layer 132. Electrically conductive structure 152 is laterally bounded by sidewalls 142 and 144. By way of example, electrically conductive structure 152 is copper formed using a plating process. Other suitable materials for electrically conductive structure 152 include nickel or the like.

Figure 8:
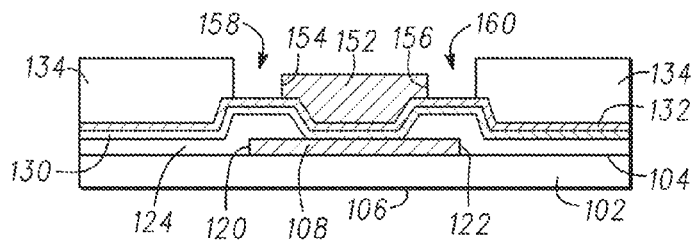
FIG. 8 is a cross-sectional view of the semiconductor component of FIG. 7 at a later stage of manufacture.

Referring now to FIG. 8, portions 146 and 148 of photoresist layer 134 are developed and removed. Optionally, after removal, the remaining portions of photoresist layer 134 may be hard baked. Removal of portions 146 and 148 exposes sidewalls or edges 154 and 156 of electrically conductive structure 152 and portions 158 and 160 of electrically conductive layer 132. It should be noted that the dimension $D_{P2}$ shown in FIG. 6 is greater than the distance between sidewalls or edges 154 and 156.

Figure 9:
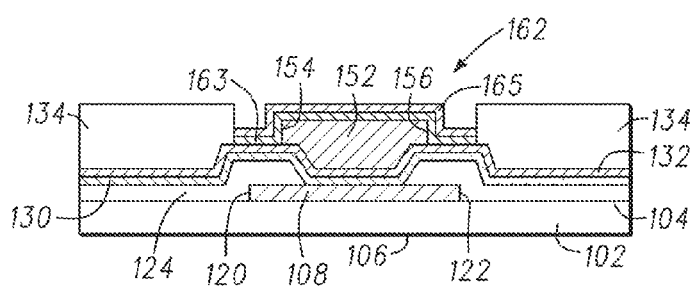
FIG. 9 is a cross-sectional view of the semiconductor component of FIG. 8 at a later stage of manufacture.

Referring now to FIG. 9, an electrically conductive structure or material 162 is formed over electrically conductive structure 152, along sidewalls 154 and 156, and over the uncovered portions 158 and 160 of electrically conductive layer 132. Electrically conductive structure 162 may be referred to as a protective structure and may be comprised of one or more layers. Preferably, electrically conductive structure 162 is a multi-layer structure that is formed using an electroplating technique and that protects electrically conductive structure 152. For example, electrically conductive structure 162 may be a two layer structure comprising a first electrically conductive layer 163 formed in contact with electrically conductive structure 152 and a second electrically conductive layer 165 formed in contact with the first electrically conductive layer 163. In accordance with an embodiment of the present invention, the first electrically conductive layer 163 is nickel and the second electrically conductive layer 165 is gold. Alternatively, the first electrically conductive material 163 may be nickel and the second electrically conductive layer 165 may be tin; or the first electrically conductive material 163 may be nickel and the second electrically conductive material 165 may be palladium; or the first electrically conductive material 163 may be tin and the second electrically conductive material 165 may be palladium; or the first electrically conductive material 163 may be a copper and the second electrically conductive material 165 may be gold; or the first electrically conductive material 163 may be copper and the second electrically conductive material 165 may be tin; or the first electrically conductive material 163 may be nickel and the second electrically conductive layer 165 may be solder; or the first electrically conductive material 163 may be solder and the second electrically conductive layer 165 may be tin; or the like.

It should be further noted that suitable materials for covering the copper are those that protect the copper from oxidizing. Although structure 162 has been described as being an electrically conductive structure, this is not a limitation of the present invention. Structure 162 may be formed from an electrically nonconductive material such as, epoxy, polyimide, or the like.

Figure 10:
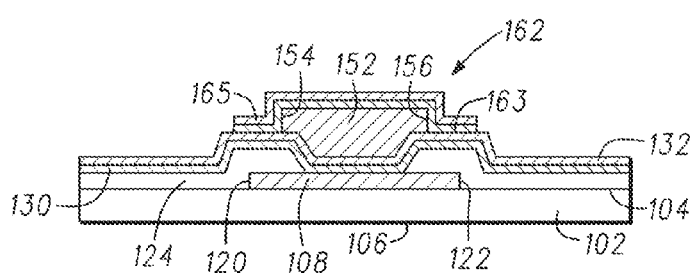
FIG. 10 is a cross-sectional view of the semiconductor component of FIG. 9 at a later stage of manufacture.

Referring now to FIG. 10, photoresist layer 134 is removed using techniques known to those skilled in the art.

Figure 11:
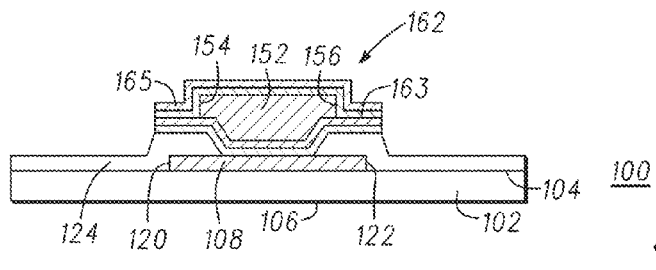
FIG. 11 is a cross-sectional view of the semiconductor component of FIG. 10 at a later stage of manufacture.

Referring now to FIG. 11, the exposed portions of electrically conductive structure 129 are removed using, for example, a wet chemical etching process. The technique for removing electrically conductive structure 129 is not a limitation of the present invention.

Figure 12:
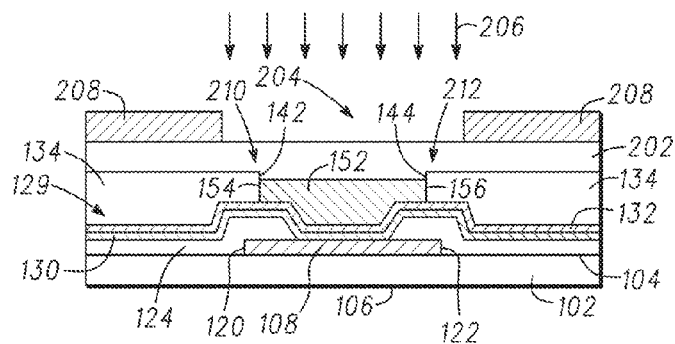
FIG. 12 is a cross-sectional view of the semiconductor component of FIG. 5 at a later stage of manufacture in accordance with another embodiment of the present invention.

FIG. 12 is a cross-sectional view of a portion of a semiconductor component 200 during manufacture in accordance with another embodiment of the present invention. It should be noted that the beginning steps in manufacturing semiconductor component 200 are similar to those for manufacturing semiconductor component 100. Thus, the manufacturing steps shown in FIGS. 3-5 for semiconductor component 100 may be used for manufacturing semiconductor component 200. Accordingly, the description of FIG. 12 continues from that of FIG. 5, where reference character 100 has been replaced by reference character 200. Electrically conductive structure 152 is formed on the exposed portion of electrically conductive layer 132. Electrically conductive structure 152 is laterally bounded by sidewalls 142 and 144. By way of example, electrically conductive structure 152 is copper formed using a plating process. Other suitable materials for electrically conductive structure 152 include nickel or the like.

A layer of a photosensitive material 202 such as, for example, photoresist, is formed on electrically conductive structure 152 and on the remaining portion of photoresist layer 134. In accordance with embodiments of the present invention, photoresist layer 202 is a positive photoresist.

A portion 204 of photoresist layer 202 is exposed to light 206 such as, for example UltraViolet (UV) radiation, through a plating mask 208. In addition portions 210 and 212 of photoresist layer 134 underlying the portion of photoresist layer 202 that is unprotected by plating mask 208 are also exposed to light 206.

Figure 13:
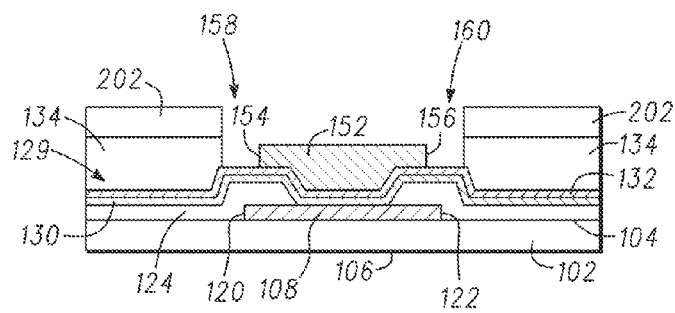
FIG. 13 is a cross-sectional view of the semiconductor component of FIG. 12 at a later stage of manufacture.

Referring now to FIG. 13, the portions of photoresist layer 202 and portions 210 and 212 of photoresist layer 134 that were exposed to light 206 (shown in FIG. 12) are developed and removed. Optionally, after removal, the remaining portions of photoresist layers 134 and 202 may be hard baked. Removal of portions 210 and 212 exposes sidewalls or edges 154 and 156 of electrically conductive structure 152 and portions 158 and 160 of electrically conductive layer 132.

Figure 14:
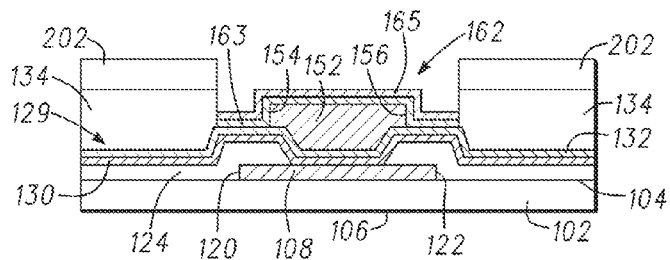
FIG. 14 is a cross-sectional view of the semiconductor component of FIG. 13 at a later stage of manufacture.

Referring now to FIG. 14, an electrically conductive structure or material 162 is formed over electrically conductive structure 152, along sidewalls 154 and 156, and over the uncovered portions 158 and 160 of electrically conductive layer 132. Preferably, electrically conductive structure 162 is formed using an electroplating technique. Electrically conductive structure 162 protects electrically conductive structure 152. Suitable materials for electrically conductive structure 162 have been described with reference to FIG. 9.

Figure 15:
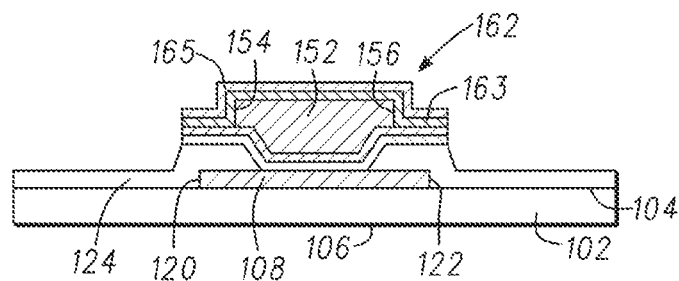
FIG. 15 is a cross-sectional view of the semiconductor component of FIG. 14 at a later stage of manufacture.

Referring now to FIG. 15, the remaining portions of photoresist layers 134 and 202 are removed using techniques known to those skilled in the art. Removing the remaining portions of photoresist layers 134 and 202 exposes portions of electrically conductive structure 129, which are removed using, for example, a wet chemical etching technique or other technique known to those skilled in the art.

Figure 16:
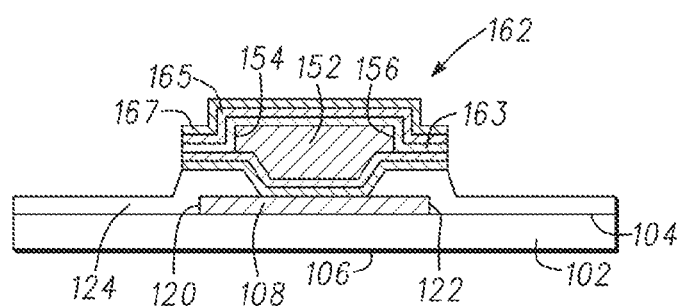
FIG. 16 is a cross-sectional view of a semiconductor component in accordance with another embodiment of the present invention.

For the sake of completeness, FIG. 16 is included to illustrate embodiments in which a semiconductor component 250 includes an electrically conductive layer 162 that is a three metal layer structure or system comprising a first electrically conductive layer 163 formed in contact with electrically conductive structure 152, a second electrically conductive layer 165 formed in contact with the first electrically conductive layer 163, and a third electrically conductive layer 167 in contact with the second electrically conductive layer 165. For example, the first electrically conductive layer 163 may be nickel, the second electrically conductive layer 165 may be palladium, and the third electrically conductive layer 167 may be gold. Alternatively, the first electrically conductive layer 163 may be copper, the second electrically conductive layer 165 may be nickel, and the third electrically conductive layer 167 may be gold; the first electrically conductive layer 163 may be copper, the second electrically conductive layer 165 may be nickel, and the third electrically conductive layer 167 may be tin; or the first electrically conductive layer 163 may be copper, the second electrically conductive layer 165 may be nickel, and the third electrically conductive layer 167 may be palladium; or the first electrically conductive layer 163 may be copper, the second electrically conductive layer 165 may be tin, and the third electrically conductive layer 167 may be palladium; or the like. It should be noted that the number of electrically conductive layers comprising electrically conductive structure 162 is not a limitation of the present invention, i.e., electrically conductive structure 162 may be comprised of a single layer, two layers, three layers, four, layers, etc.

Figure 17:
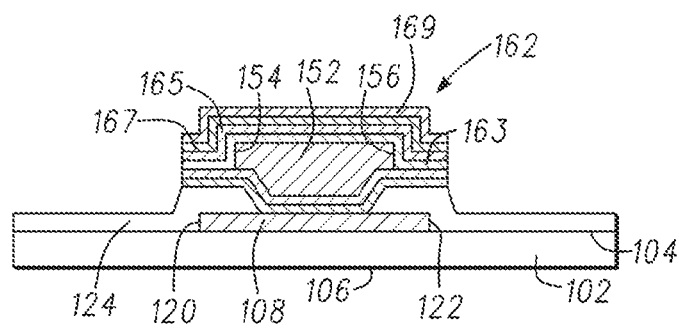
FIG. 17 is a cross-sectional view of a semiconductor component in accordance with another embodiment of the present invention.

FIG. 17 is included to illustrate embodiments in which a semiconductor component 260 includes an electrically conductive layer 162 that is a four metal layer structure or system comprising a first electrically conductive layer 163 formed in contact with electrically conductive structure 152, a second electrically conductive layer 165 formed in contact with the first electrically conductive layer 163, a third electrically conductive layer 167 in contact with the second electrically conductive layer 165, and a fourth electrically conductive layer 169 formed in contact with the third electrically conductive layer 167. For example, the first electrically conductive layer 163 may be copper, the second electrically conductive layer 165 may be nickel, the third electrically conductive layer 167 may be palladium, and the fourth electrically conductive layer 169 may be gold. As discussed above, layer 162 is not limited to being comprised of an electrically conductive material, but can be comprised of an electrically non conductive material such as, for example, epoxy, polyimide, or the like.

By now it should be appreciated that a semiconductor component having a copper protection layer and methods for manufacturing the semiconductor component have been provided. Advantages of embodiments of the present invention include a protective structure 162 adjacent the copper sidewalls protecting them from damage by etchants or other corrosive materials, prevention of copper migration, and elimination of an expensive electroless plating process. In addition, protective structure 162 forms a seal that protects electrically conductive structure 152 while allowing for overetching of protective structure 162 without uncovering the copper sidewalls or edges of electrically conductive structure 152.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a substrate having a major surface;
    forming a first electrically conductive material over the major surface, the first electrically conductive material having first and second edges;
    forming a first layer of photoresist over the first electrically conductive material;
    removing a first portion of the first layer of photoresist leaving first and second sidewalls from a remaining portion of the first layer of photoresist and a gap between the first and second sidewalls;
    forming a second electrically conductive material in the gap between the first and second sidewalls of the first layer of photoresist, the second electrically conductive material having first and second edges;
    forming a second layer of photoresist over the first layer of photoresist and over the second electrically conductive material;
    removing a portion of the second layer of photoresist and a second portion of the first layer of photoresist to uncover the first and second edges of the second electrically conductive material; and
    forming a protective structure over the first and second edges of the second electrically conductive material.

2. The method of claim 1, wherein the protective structure is a third electrically conductive material.

3. The method of claim 2, wherein the protective structure comprises at least one material selected from the group of materials consisting of nickel/gold, nickel/tin, nickel/palladium, nickel/palladium/gold, and copper/gold.

4. The method claim 1, wherein the step of removing the first portion of the first layer of photoresist comprises:
    exposing the first portion of the first layer of photoresist to ultraviolet radiation; and
    developing the exposed first portion of the first layer of photoresist; and the step of removing the portion of the second layer of photoresist and a second portion of the first layer of photoresist comprises:
    exposing the portion of the second layer of photoresist and the second portion of the first layer of photoresist to the ultraviolet radiation; and
    developing the exposed portion of the second layer of photoresist and the exposed second portion of the first layer of photoresist.

5. The method of claim 4, further including forming a third electrically conductive material between the substrate and the first electrically conductive material.

6. The method of claim 5, wherein the protective structure comprises an electrically non-conducting material.

7. The method of claim 1, wherein the protective structure includes at least one electrically conductive layer comprising one of nickel, copper, gold, and palladium.

8. The method of claim 7, wherein the protective structure further includes at least another electrically conductive layer comprising one of nickel, gold, tin, palladium, and solder.

9. A method for manufacturing a semiconductor component, comprising:
    providing a first electrically conductive material having a surface;
    forming a first photoresist mask over the surface of the first electrically conductive material, the first photoresist mask having an opening that exposes a first portion of the surface of the first electrically conductive material;
    forming a second electrically conductive material over the exposed first portion of the surface of the first electrically conductive material, the second electrically conductive material having a surface and first and second sidewalls;
    forming a second photoresist mask over the second electrically conductive material and a first portion of the first photoresist mask; and
    removing first portions of the second photoresist mask over the surface of the second electrically conductive material and second portions of each of the first photoresist mask and the second photoresist mask that are laterally adjacent to the first and second sidewalls of the second electrically conductive material.

10. The method of claim 9, further including forming a first metal layer over portions of the first and second sidewalls and the surface of the second electrically conductive material.

11. The method of claim 10, further including forming a second metal layer over the first metal layer.

12. The method of claim 9, further including removing the first photoresist mask and the second photoresist mask to expose second portions of the first electrically conductive material and removing the exposed second portions of the first electrically conductive material.

13. The method of claim 11, wherein the first metal layer comprises a metal selected from the group of metals consisting of nickel, tin, copper, and solder and the second metal layer comprises a metal selected from the group of metals consisting of gold, tin, palladium, and solder.

14. The method of claim 9, wherein the step of forming the second electrically conductive material over the exposed portion of the surface of the first electrically conductive material comprises plating copper on the exposed first portion of the surface of the first electrically conductive material, the copper serving as the second electrically conductive material.

15. The method of claim 9, wherein the step of removing the first portions of the second photoresist mask over the surface of the second electrically conductive material and second portions of each of the first photoresist mask and the second photoresist mask that are laterally adjacent to the first and second sidewalls of the second electrically conductive material comprises:
    exposing the first portions of the second photoresist mask over the surface of the second electrically conductive material and the second portions of the first and second photoresist masks that are laterally adjacent to the first and second sidewalls of the second electrically conductive material to light; and developing the first portions of the second photoresist mask and the second portions of each of the first photoresist mask and the second photoresist mask that were exposed to the light.

16. The method of claim 15, further including:

forming a protective layer over portions of the first and second sidewalls and the surface of the second electrically conductive material;

removing the first photoresist mask and the second photoresist mask to expose second portions of the first electrically conductive material; and removing the exposed second portions of the first electrically conductive material.

17. A method for manufacturing a semiconductor component, comprising:

providing a substrate having a first surface;

forming a first electrically conductive structure over the first surface;

forming a first layer of photoresist over the first electrically conductive structure;

exposing a first portion of the first layer of photoresist to light;

removing the first portion of the first layer of photoresist to form a first photoresist mask having sidewalls spaced apart by a first opening that exposes a first portion of the first electrically conductive structure;

forming a second electrically conductive structure over the first electrically conductive structure, the second electrically conductive structure having sidewalls that are laterally adjacent the sidewalls of the first photoresist mask;

forming a second layer of photoresist over the second electrically conductive structure and over the first photoresist mask;

exposing a first portion of the second layer of photoresist and a portion of the first photoresist mask to the light;

removing the first portion of the second layer of photoresist and the portion of the first photoresist mask to form a second photoresist mask having sidewalls spaced apart by a second opening that exposes a portion of the second electrically conductive structure; and forming a protective layer over the second electrically conductive structure.

18. The method of claim 17, wherein forming the second electrically conductive structure includes forming the sidewalls of the second electrically conductive structure to contact the sidewalls of the first photoresist mask.

19. The method of claim 17, further including exposing the first surface of the substrate by removing the second photoresist mask and a second portion of the first electrically conductive structure.

20. The method of claim 17, wherein forming the second electrically structure includes plating copper on the first electrically conductive structure.

* * * * *